United States Patent [19]

Butner et al.

[11] 4,196,444
[45] Apr. 1, 1980

[54] ENCAPSULATED POWER SEMICONDUCTOR DEVICE WITH SINGLE PIECE HEAT SINK MOUNTING PLATE

[75] Inventors: Karl Bütner, Freising; Josef Hehnen, Neufahrn; Reiner Rüdiger, Freising, all of Fed. Rep. of Germany

[73] Assignee: Texas Instruments Deutschland GmbH, Freising, Fed. Rep. of Germany

[21] Appl. No.: 23,558

[22] Filed: Mar. 26, 1979

Related U.S. Application Data

[63] Continuation of Ser. No. 857,953, Dec. 5, 1977, abandoned.

[30] Foreign Application Priority Data

Dec. 3, 1976 [DE] Fed. Rep. of Germany ....... 2654960

[51] Int. Cl.² .................... H01L 23/02; H01L 23/48; H01L 29/44
[52] U.S. Cl. .......................... 357/81; 357/68; 357/72; 357/74; 174/16 HS
[58] Field of Search .................. 357/65, 68, 72, 74, 357/81; 174/16 HS

[56] References Cited

U.S. PATENT DOCUMENTS

| | | | |
|---|---|---|---|
| 2,993,153 | 7/1961 | Wagner | 357/72 |
| 3,209,065 | 9/1965 | Steiner | 357/72 |
| 3,268,778 | 8/1966 | Worsham | 357/74 |
| 3,280,390 | 10/1966 | Rossie et al. | 357/74 |
| 3,417,300 | 12/1968 | Kauffman | 357/81 |
| 3,475,662 | 10/1969 | Zido | 357/72 |
| 3,532,944 | 10/1970 | Lendorf et al. | 357/81 |
| 3,577,633 | 5/1971 | Homma | 357/72 |
| 3,611,555 | 10/1971 | Nier | 357/81 |
| 3,708,722 | 1/1973 | Wiles | 357/72 |
| 3,713,007 | 1/1973 | Walter | 357/72 |

FOREIGN PATENT DOCUMENTS

7606781 12/1976 Netherlands ............... 357/72

Primary Examiner—Andrew J. James
Attorney, Agent, or Firm—Mel Sharp; James T. Comfort; N. Rhys Merrett

[57] ABSTRACT

A simplified power semiconductor device comprising a single-piece impact-extruded aluminum heat sink/support having a recess in one surface surrounded by an upstanding annular collar. The semiconductor chip is soldered to the floor of the recess and has contact zones at its opposite surface. Nail head leads are bonded to the contact zones. Encapsulation is completed by a mass of plastic or glass within the collar or by a sealing disc closing the collar through which the leads project.

7 Claims, 6 Drawing Figures

ENCAPSULATED POWER SEMICONDUCTOR DEVICE WITH SINGLE PIECE HEAT SINK MOUNTING PLATE

This is a continuation of application Ser. No. 857,953, filed Dec. 5, 1977 and now abandoned.

This invention relates to a power semiconductor device comprising a semiconductor crystal arranged on a baseplate and connecting conductors which are connected to contact zones on the semiconductor crystal.

One problem affecting power semiconductor devices is to dissipate the heat generated by losses in the semiconductor crystal. A baseplate with the semiconductor crystal firmly soldered to its upper surface is currently used for this purpose. In order to make the connections, conductors are guided through the baseplate by means of glass bushings from that side remote from the semiconductor crystal and are then connected to contact zones on the semiconductor crystal by means of thin wires. One connection of such a semiconductor device may be formed by the baseplate itself. However, it is also possible to use a separate connecting conductor which is electrically connected to the baseplate. Accordingly, the connecting conductors of a power semiconductor device of this type project from that surface of the baseplate which is remote from the semiconductor crystal.

In order to protect the semiconductor crystal and the connecting wires to the end faces of the connecting conductors, a cylindrical metal cap is placed over the semiconductor crystal and soldered or welded to the baseplate.

The production of a conventional power semiconductor device of this type involves a number of individual operations and is therefore complicated and expensive. The production of the baseplate alone involves several operations because the connecting wires have to be fused into it by means of glass bushings. On account of the expense involved in its production, the baseplate thus produced is an important factor in the overall costs of the final semiconductor device.

The object of the present invention is to construct a power semiconductor device in such a way that it can be produced much more simply and, hence, inexpensively.

According to the invention, this object is achieved in that the connecting conductors project from that side of the baseplate on which the semiconductor crystal is arranged, and in that a cover through which the connecting conductors extend is arranged over the semiconductor crystal.

In a power semiconductor device embodying the invention, the baseplate can be produced in a single operation by impact extrusion. After the semiconductor crystal has been introduced and the connecting conductors placed in position, a cover is put on, this cover reliably protecting the semiconductor crystal and, at the same time, fixing the connecting conductors. Accordingly, there is no longer any need for a separate protective cap. As a result, a considerable reduction is obtained in the number of operations and, hence, overall costs involved in the production of a semiconductor device such as this.

A semiconductor device embodying the invention is preferably constructed in such a way that the baseplate is formed with a collar which annularly surrounds that region of the baseplate which is intended to receive the semiconductor crystal, and in such a way that the cover closes off the space surrounded by the collar. With a baseplate formed in this way, the cover is particularly simple to put on because the collar provides for reliable holding of the cover.

That edge of the collar which is remote from the baseplate is preferably flanged inwards. Shaping the edge of the collar in this way improves the hold of the cover on the baseplate.

The cover preferably consists of a plastics material or glass cast around the connecting conductors and the semi-conductor crystal. Covering materials of this kind provide for safe protection of the semiconductor crystal and for reliable fixing of the connecting conductors.

Further developments of the invention are characterised in the subsidiary claims.

The invention is described by way of example in the following with reference to the accompanying drawings, wherein.

Figure 1:
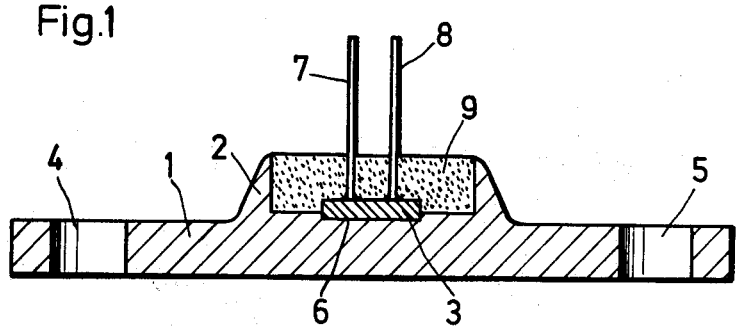
FIG. 1 is a sectional view of a power semiconductor device according to the invention.

FIG. 1 is a sectional view of a semiconductor device in the form of a power transistor. This power transistor consists of a baseplate 1 onto which a collar 2 is integrally formed. As can be seen from the plan view of FIG. 2, the collar 2 annularly surrounds the region intended to receive the semiconductor crystal 3. The baseplate has two holes 4 and 5 for fixing the power transistor of FIG. 1.

Figure 3A:
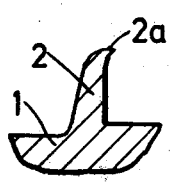
FIGS. 3a and 3b are partial illustrations of the collar formed onto the baseplate with an inwardly flanged edge and a stepped edge, respectively.

In the region surrounded by the collar 2, the baseplate 1 is formed with a recess 6 in which the semiconductor crystal 3 is accommodated. The connecting conductors 7 and 8 are directly connected to the emitter zone and base zone, respectively, of the semiconductor crystal 3. They project from that side of the baseplate 1 on which the semiconductor crystal 3 is arranged. For protecting the semiconductor crystal and for fixing the connecting conductors 7 and 8, a filling 9 acting as cover is cast into the space surrounded by the collar 2. This filling may be a hardenable plastics material or even glass. In cases where plastics material is used for the filling, it is of advantage for that edge 2a of the collar 2 which is remote from the baseplate 1 to be flanged inwards, as shown in FIG. 3a. This provides for good retention of the plastics material in the space surrounded by the collar. Where glass is used, the edge of the collar may be straight, as shown in FIG. 1.

Preferably, the material used for the baseplate 1 with the integrally formed collar 2 is aluminum which enables production to be carried out in a single operation by impact extrusion. Since aluminum is relatively inexpensive by comparison with the copper used as baseplate for conventional power transistors, the baseplate may readily be made thicker so that a better cooling effect is obtained.

Figure 2:
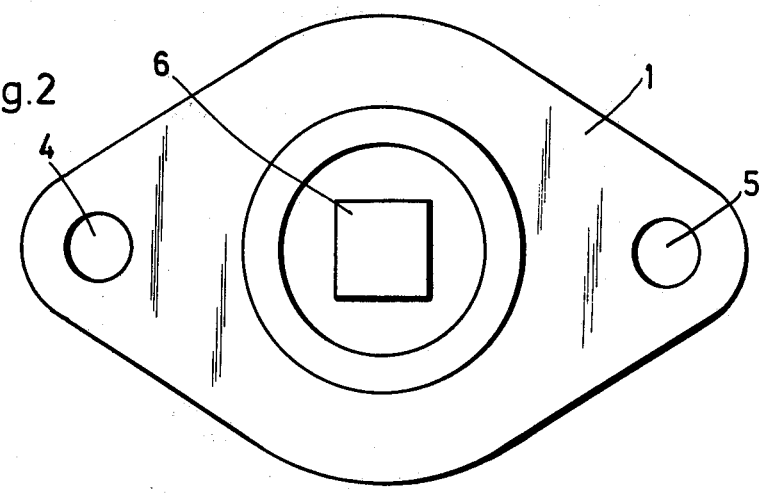
FIG. 2 is a plan view of the baseplate of the device shown in FIG. 1.

As shown in FIG. 2, the baseplate 1 is in the form of a rhombus with rounded-off corners corresponding to the shape of the known TO3 power transistor housing. Like the known power transistors with TO3 housings, the power transistor described here may be mounted on a heat sink. The only difference is that the baseplate is screwed onto that surface of the heat sink which is opposite the usual fixing surface. The connecting conductors no longer project through the heat sink, but are still directed to the same side as in the known TO3 housing.

Figure 4:
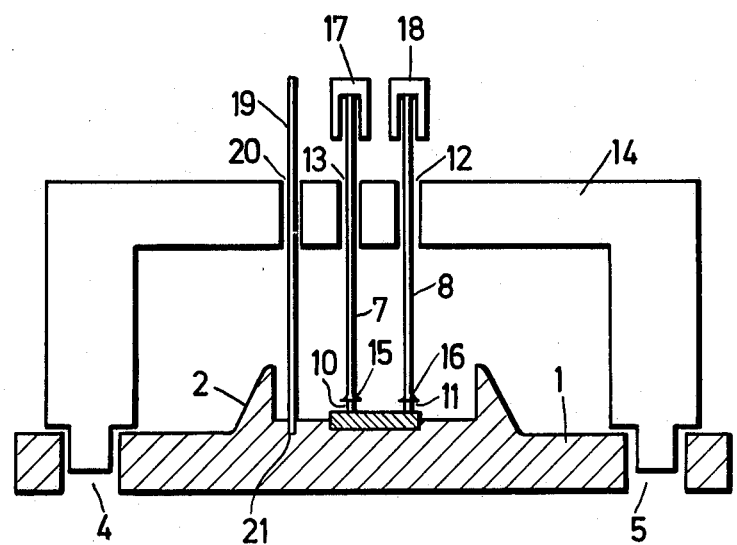
FIG. 4 is a highly simplified diagrammatic view illustrating the production of the power semiconductor device according to the invention.

It will now be explained with reference to FIG. 4 how the power transistor described here is produced. As already mentioned, the baseplate 1 with the integrally formed collar 2 is produced from aluminium in a single operation by impact extrusion. The semiconductor crystal 3, of which the rear is provided with an electrolytically deposited lead-tin layer, is then placed in the recess 6 formed in the baseplate 1. Silver beads 10 and 11 coated with a lead-tin alloy are then placed on top of the semiconductor crystal for contacting the emitter and base zones. The connecting conductors 7 and 8 with their nailhead-like ends 15 and 16 are then placed on the silver beads 10 and 11 through openings 12 and 13 in a holder 14 and weighted with weights 17 and 18. The important alignment of the connecting conductors 7 and 8 with the silver beads 11 and 12 is guaranteed by engaging the holder 14 in the holes 4 and 5 of the baseplate 1. In cases where a separate connecting conductor is required for the collector, an additional connecting conductor 19 may be guided through another opening 20 in the holder 14 and inserted into a bore in the baseplate 1.

The entire arrangement is then heated in a reducing atmosphere to the melting temperature of the lead-tin solder. During this heating process, the semiconductor crystal 3 is soldered to the baseplate 1 and the connecting conductors 7 and 8 to the silver beads 10 and 11. The connecting conductor 19 optionally used for the collector is also similarly soldered in the bore 21.

After this heating process, the filling 9 is cast into the space surrounded by the collar 2, after which the holder 14 is removed. This step concludes the production of the power transistor.

Figure 3B:
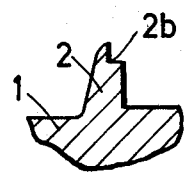
Figure 5:
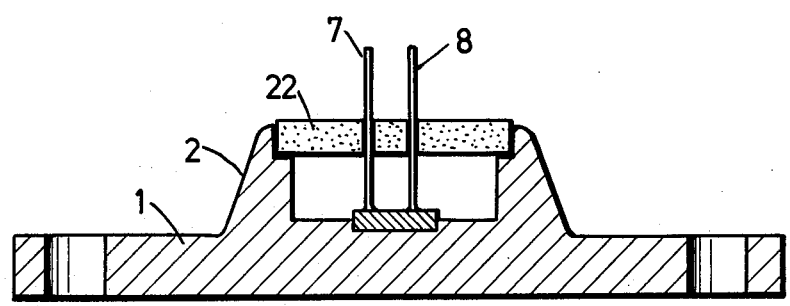
FIG. 5 shows a power semiconductor device in which the edge of the collar formed on the baseplate has the configuration shown in FIG. 3b and in which a disc-shaped cover is used.

FIG. 5 is a section through a power transistor in which the upper edge of the collar 2 formed onto the baseplate 1 is shaped in such a way that a disc 22 can easily be fitted on to act as a cover. This particular configuration of the collar edge 26 is shown in FIG. 3b. The disc 22 may consist of a ceramic material or of glass. In cases where a ceramic material is used, the regions which come into contact with the collar edge 26 and the inner surfaces of the holes through which the connecting conductors 7 and 8 extend are metallised to enable soldered connections to be made. Where glass is used, small metal tubes may be inserted into the disc 2 for guiding the connecting conductors 7 and 8 through the disc.

What is claimed is:

1. A power semiconductor device comprising an electrically and thermally conductive base plate defining a combination heat sink and electrical terminal mounting plate having a recess in one major surface thereof accommodating a semiconductor body, said base plate having a major surface opposite said one major surface that is free of projections and provides a substantially flat mounting area wholly circumscribing said recess and of substantially greater area than that of said recess; said semiconductor body having a surface bonded to the floor of said recess in electrically and thermally conductive relation with said base plate such that said base plate provides direct electrical terminal contact means for said surface of the semiconductor body; said base plate including an integral collar surrounding and laterally spaced from said recess and projecting upwardly significantly above said semiconductor body; a plurality of straight connecting conductor wires having end portions secured to contact zones of said semiconductor body on a surface of said body opposite from said surface bonded to the floor of said recess; all of said conductors upstanding vertically from said contact zone surface within the perimeter of said collar and projecting beyond said collar; and cover means comprising a single mass of protective insulating material surrounding and covering said semiconductor body within and filling the peripheral confines of and retained by said collar and through which said conductors project; said mass of insulating material securing the conductors in place in said vertical position within the collar.

2. A power semiconductor device as claimed in claim 1, wherein said cover means includes a disc supported by said collar adjacent an edge thereof remote from said baseplate and through which disc the connecting conductors projects.

3. A power semiconductor device as claimed in claim 1, wherein the baseplate is in the form of a rhombus with rounded-off corners.

4. Where a power semiconductor device as claimed in claim 1, wherein said baseplate and collar comprise a single-piece aluminum member and said protective insulating material comprises a material flowable to conform to the space within said collar.

5. A power semiconductor device as claimed in claim 1, wherein said protective insulating material is a plastics material and said collar has an inwardly directed flange engaging said plastics material.

6. An encapsulated power semiconductor device comprising a single-piece heat sink and mounting means comprising a thermally and electrically conductive base plate having an upstanding annular collar on one major surface thereof, said base plate having a recess laterally spaced from and surrounded by said collar; said base plate having a major surface opposite said one surface that is free of projections and provides a substantially flat mounting area wholly circumscribing and of substantially greater area than that of said recess; a semiconductor body accommodated by said recess and having a surface bonded to the floor of said recess to provide thermal and electrical conductive terminal connection to said base plate; said semiconductor body having a surface opposite that bonded to the floor of the recess defining a plurality of contact zones; a plurality of elongated, straight conductive connectors each having an enlarged area contact surface at one end thereof extending transversely of the length of the connector and secured to a respective contact zone of said semiconductor body so that said connector is upstanding from the contact zone and extends beyond said collar; and a single piece mass of protective insulating material embedding said semiconductor body and said connectors within said collar, said insulating material filling and conforming to the cross-sectional area of said annular collar; said annular collar projecting sufficiently upwardly beyond the semiconductor body that the mass of insulating material secures portions of said connectors embedded within said collar in positions parallel to the axis of said collar.

7. An encapsulated power semiconductor device as claimed in Claim 6, wherein said baseplate and collar is an extruded aluminum member and wherein said protective insulating material comprises a plastics material engaged by an inwardly extending flange of said collar located adjacent an edge thereof remote from said baseplate.

* * * * *